United States Patent
Byun et al.

(10) Patent No.: US 6,952,126 B2
(45) Date of Patent: Oct. 4, 2005

(54) CHARGE PUMP CIRCUIT FOR A PLL

(75) Inventors: Sang Jin Byun, Daejeon (KR); Beomsup Kim, Cupertino, CA (US); Chan-Hong Park, Seoul (KR)

(73) Assignee: Berkana Wireless, Inc., Campbell, CA (US)

( * ) Notice: Subject to any disclaimer, the term of this patent is extended or adjusted under 35 U.S.C. 154(b) by 48 days.

(21) Appl. No.: 10/438,178

(22) Filed: May 13, 2003

(65) Prior Publication Data

US 2004/0004500 A1 Jan. 8, 2004

Related U.S. Application Data

(63) Continuation of application No. 10/259,245, filed on Sep. 27, 2002, now abandoned.

(30) Foreign Application Priority Data

Sep. 29, 2001 (KR) ............................. 10-2001-00610465

(51) Int. Cl.$^7$ ............................................. H03L 7/06
(52) U.S. Cl. ............................................. 327/157
(58) Field of Search ............................. 327/148, 157

(56) References Cited

U.S. PATENT DOCUMENTS 5,705,947 A * 1/1998 Jeong .......................... 327/270
5,825,640 A * 10/1998 Quigley et al. ............... 363/60
5,920,215 A * 7/1999 Drost et al. ................... 327/157
6,169,458 B1   1/2001 Shenoy et al. ................ 331/17
6,292,061 B1 * 9/2001 Qu .............................. 331/17
6,611,160 B1 * 8/2003 Lee et al. .................... 327/157

FOREIGN PATENT DOCUMENTS

KR   000052532 A   8/2000
KR   000067250 A   11/2000   ............. H03L/7/08

OTHER PUBLICATIONS

Samavati, Hirad, et al., A Fully–Integrated 5 GHz CMOS Wireless–LAN Receiver, Stanford University, Stanford, CA, 2001 IEEE International Solid State Circuits Conference, 2001.

* cited by examiner

Primary Examiner—Terry D. Cunningham
(74) Attorney, Agent, or Firm—Van Pelt, Yi & James LLP

(57) ABSTRACT

A technique is disclosed for providing a charge pump circuit for phase locked loop (PLL) to reduce mismatch of up/down currents and feed-through of up/down currents to voltage output. Elimination of feed-through of the input signal may be achieved by using differential switches (M1 and M2, and M3 and M4) based on DC reference voltage in the charge pump and also eliminate the mismatch of up/down currents in a wide voltage output range by applying a new replica biasing using feedback.

7 Claims, 4 Drawing Sheets

CHARGE PUMP CIRCUIT FOR A PLL

CROSS REFERENCE TO RELATED APPLICATIONS

This application is a continuation of U.S. patent application Ser. No. 10/259,245, entitled "CHARGE PUMP CIRCUIT FOR PLL" filed Sep. 27, 2002 now abandoned which is incorporated herein by reference for all purposes, which claims priority to Republic of Korea Patent Application No. 10-2001-00610465, filed Sep. 29, 2001, which is incorporated herein by reference for all purposes.

FIELD OF THE INVENTION

The present invention relates generally to charge pump circuits. More specifically, a charge pump circuit for a PLL is disclosed.

BACKGROUND OF THE INVENTION

In general, an important factor in designing a charge pump circuit is minimizing the mismatch of up/down currents. FIG. 1 illustrates several aspects of mismatch and feed-through of up/down currents in a conventional charge pump. Due to internal delays that may be unavoidable, regardless of the type of phase frequency detector (PFD) in use, an interval may exist where both "up" and "down" current signals merge, as shown in FIG. 1(a). At the interval of internal delay, the paths of the up/down currents of a charge pump merge into each other, as shown in FIG. 1(b).

If the size of the up/down currents are exactly the same, no charge will flow to a loop filter and the control voltage will not be affected. However, a difference between the two currents will occur and cause periodic noise within the control voltage as shown in FIG. 1(c), even if the phase of the voltage waveform is locked. The periodic noise appears in the output signal of the PLL in the form of spurious noise, and its position is the same as the frequency of the input signal of the phase frequency detector (PFD). For example, in a frequency synthesizer PLL of the integer-N mode, when the comparison frequency is 1 MHz, the spurious noise appears with a 1 MHz offset from the carrier frequency.

Another conventional aspect of typical charge pump circuits is the feed-through noise of the up/down currents. This aspect refers to a phenomenon whereby the up/down signals swing between a power source (VDD) and a ground (GND). The up/down signal is delivered by a parasitic capacitor to an output, which adversely affects the control voltage. Every switch of up/down signals can cause periodic noise to be introduced into the control voltage, which subsequently generates spurious noise, requiring minimization of feed-through.

Additionally, mismatched up/down currents can be created using conventional charge pump techniques. For example, a mismatch may occur as a result of limited transistor output resistance, charge-sharing during switching, and mismatched transistors. A mismatch caused by limited transistor output resistance can occur if a source/sink of a charge pump includes an ideal current source, where the current may be constant without regard to voltage output (e.g., without regard to voltages at both terminals of the current source). However, an ideal current source may not be a realistic situation and current output can change slightly along with changes of the voltage output. FIG. 2 illustrates a graph of current output with regard to voltage output of a conventional charge pump, plotting a real versus an ideal case scenario, as described above. Thus, except for one point in the voltage output, inevitably, a difference exists between the up/down currents.

One conventional technique for solving mismatched up/down currents is illustrated in FIG. 3. As shown in FIG. 3, an output terminal of a charge pump can be implemented in cascade mode in order to increase output resistance. However, this implementation may be problematic in terms of reducing the dynamic range of the output of the charge pump.

Another problematic area of conventional charge pumps can be charge-sharing effects. A charge sharing effect may be created by an instantaneous change in the voltage output due to a difference in charged voltages between an output load capacitor and a parasitic capacitor of a switching transistor when switching up/down signals. Referring to FIG. 4, when transistor M1 is off and transistor M2 is on, a down current flows changing the charged voltage, Vout, of a capacitor (CL). Simultaneously, VA is charged to Vdd, as M1 is on and M2 is off. If M1 and M2 are both on and CP and CL are charged with different voltages (VA and Vcont, respectively), then an instantaneous charge distribution occurs. The charge distribution causes an unwanted change in the voltage output by as much as ΔV. In order to avoid this, VA should be charged to Vout instead of Vdd using a feedback even when M2 is off, as illustrated in FIG. 5.

As illustrated in FIG. 5, VA can be charged to Vout instead of Vdd, using a feedback including when M2 is off. However, while charging to Vout can reduce the charge distribution effect, feed-through of the switching signals is unavoidable because the switching transistor is directly connected to the output node.

The transistor mismatch discussed above refers to transistor mismatch. A current mismatch occurs due to size mismatch following process changes when the current mirror generates up/down currents. To reduce transistor mismatch, a conventional technique provides for reducing mismatch by trimming the up or down current after a processor has been manufactured. However, this technique is problematic in that every processor would require measurement and trimming.

Another conventional embodiment includes a charge pump circuit, as illustrated in FIG. 6, which was designed with an emphasis on the mismatch of up/down currents. The conventional circuit embodied in FIG. 6 uses replica bias to equalize up/down currents, regardless of changes in output node voltage. In other words, as Vout and Vr become equal via the feedback network and as the PMOS current and the PMOS gate voltage are determined by the replica bias, the up/down currents equalize using the voltage outputs from corresponding areas of the charge pump with the same structure. However, the conventional circuit shown in FIG. 6 is insufficient to prevent feed-through of up/down currents in light of the charge-sharing problem described above. Further, giving the buffer a sufficiently wide dynamic range is difficult, when attempting to equalize the DC level of Qn and Qp. Conventional charge pumps are problematic in that the range of voltage output may be small and inhibit the feedback loop from operating properly. Thus, the feed-through of the up/down signals may affect Qn causing the feedback loop to operate incorrectly.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

Techniques for a charge pump circuit for a phase locked loop (PLL) are disclosed. Embodiments include a charge pump circuit to solve conventional problems, including mismatch of up/down currents and feed-through of up/down currents to voltage output.

In order to solve the up/down current mismatch and feed-through problems, embodiments of the charge pump circuit for a PLL are designed to reduce the charge-sharing and feed-through effects by using differential switches of current steering mode. Embodiments also provide for up/down currents to automatically match each other even when output resistance is small and, if transistor size is a factor, use differential switches to construct a replica bias circuit.

Figure 7:
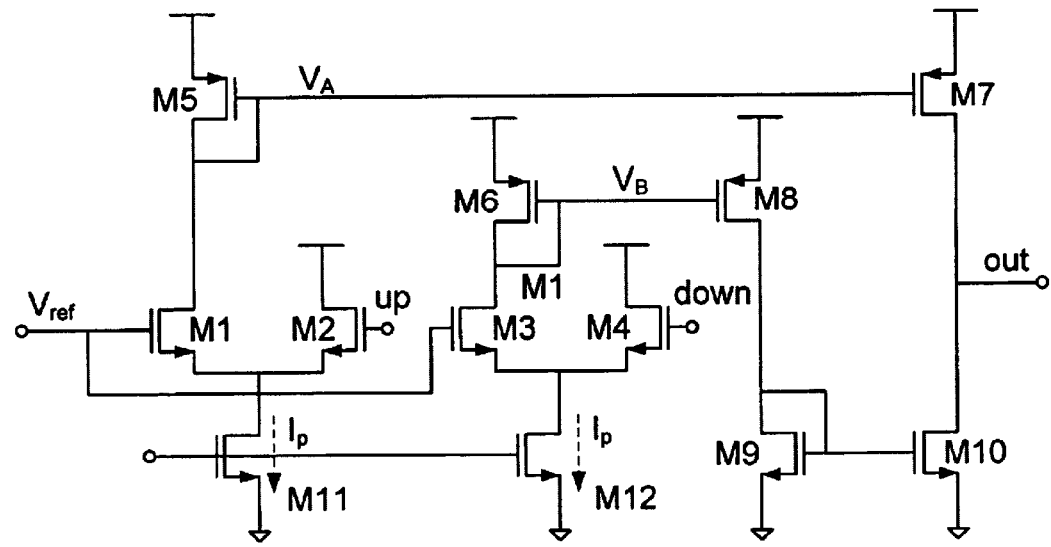
FIG. 7 is an exemplary diagram of a typical charge pump circuit for a phase locked loop (PLL)

FIG. 7 is an exemplary circuit diagram of a typical charge pump for a PLL. As illustrated, the embodiment shown includes a series of transistors 1 through 11 (M1 through M11). Transistor 1 (M1) has a reference voltage (Vref) applied to its gate. At transistor 2 (M2), the source is jointly connected with the source of transistor 1 (M1) and the gate is applied with an up signal as control voltage 1, Further, a power supply voltage (VDD) is applied to the drain of transistor 2. The gate of transistor 7 (M7) is connected to the gate of the transistor 5 (M5) and a power supply voltage (VDD) is applied to the source of transistor 7. The gate of transistor 8 (M8) is connected to the gate of transistor 6 (M6) and a power supply voltage (VDD) is applied to the source of transistor 8. The drain of transistor 9 (M9) is connected to the source of transistor 8 (M8) and the source is grounded. The gate and the drain of transistor 8 are also jointly connected. The gate of Transistor 10 (M10) is connected to the gate of transistor 9 (M9) and the drain is connected to the drain of transistor 7 (M7). The source of transistor 10 is grounded. Transistor 11 (M11) is the first current source (Ip), where the drain and the source are connected between the common source of transistors 1 and 2 (M1, M2) and the ground. Transistor 12 (M12) is the second current source (Ip) and the drain and the source are connected between the common source of transistors 3 (M3) and 4 (M4) and the ground. The gate of transistor 12 is jointly connected to the gate of transistor 11 (M11). Also, an output terminal (out) is formed at the point connecting the drain of transistor 7 (M7) and the drain of transistor 10 (M10) for forming a charging/discharging path for capacitor (C).

In accordance with the embodiment shown in FIG. 7, the charge pump uses differential current steering. One side of the differential cells (71, 72) is connected to the up/down current signals, and the other side is connected to the reference voltage, which is preset to "VDD/2." As the up/down signals fall within the range of 0 to Vdd, if the up/down signals are high (i.e. the signals approach Vdd), then tail currents may flow into transistor 2 (M2) or transistor 4 (M4), due to differential structure characteristics. There may be very little or no current flow into transistors 1 and 3 (M1, M3).

For example, when transistor 2 (M2) is on and transistor 4 (M4) is off, no current flows into transistor 5 (M5), although current may flow into transistor 6 (M6). Thus, the output capacitor (not shown) is connected between the output terminal (OUT) and the ground may be discharged.

Another feature is the feed-through aspect of the up/down signals to the output terminal (out). Feed-through can be avoided by blocking signals from reaching the output terminal during the transition of up/down signals. This becomes possible because one node of the differential switches (M1 and M2, and M3 and M4) is connected to a constant DC voltage (e.g., "VDD/2") such as the reference voltage (Vref). As transistors 1 and 3 (M1, M3) are connected to the reference voltage (Vref) and are not completely off, the voltage VA and the voltage VB are pre-charged to an amount slightly higher than "VDD-VT." The voltage may switch off transistor 5 (M5) and transistor 6 (M6) and when current flows again, the difference between VA/VB and the voltage output may becomes less than VA/VB pre-charged to Vdd, thus reducing the problematic charge-sharing effect described above.

Figure 8:
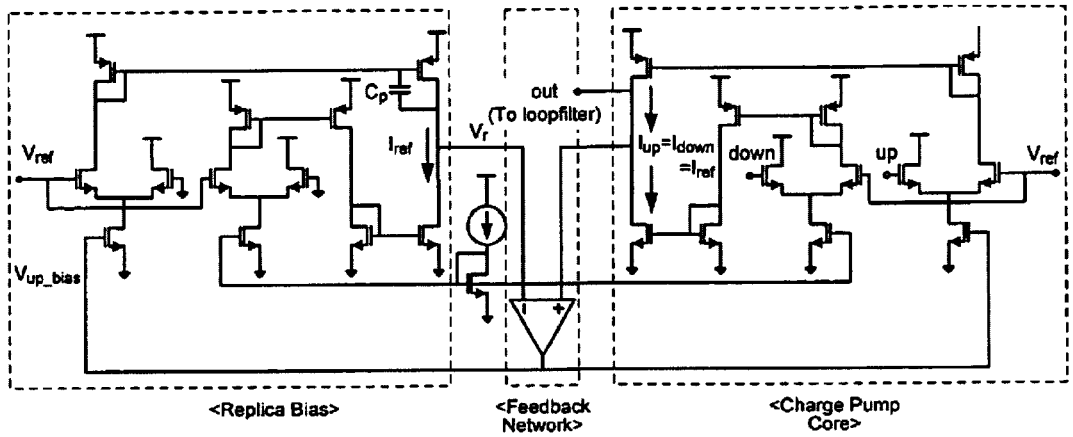
FIG. 8 is a diagram of an exemplary charge pump circuit for PLL.

FIG. 8 is an exemplary circuit diagram of a charge pump for a PLL in accordance with another embodiment. As illustrated, the circuit includes components similar to those of FIG. 8, except for the difference between transistors 11 and 12 (M11 and M12). In order to examine the difference, the exemplary circuit includes a charge pump core circuit (81), where the drain of transistor 11 (M11) is connected to the common source of transistors 1 and 2 and the source is grounded. Further, the drain of transistor 12 (M12) is connected to the common source of transistors 3 and 4 and the source is similarly grounded. Also included are a replica bias circuit (92), which can be configured similarly to the charge pump core circuit (81). A Feedback Network (83) is also shown where a non-inverting terminal (+) is connected to an output terminal (out) of the charge pump core circuit (81). The inverting terminal (−) is connected to the output terminal of the replica bias circuit (82), and the output terminal of an op amp is jointly connected to the gate of the transistor 11 (M11) of the charge pump core circuit (81) and to the gate of the relevant transistor (M11') of the corresponding replica bias circuit (82). The gate of transistor 13 (M13) is jointly connected to the gate of transistor 12 (M12). The gate of transistor 13 is also jointly connected to the gate of the relevant transistor (M12') of the corresponding replica bias circuit (82) and the source is grounded. The gate and the drain of transistor 13 are also connected to each other. A current source (11) is connected between a power supply voltage (VDD) and a drain of transistor 13 (M13).

FIG. 8 illustrates an embodiment of a charge pump for a phase locked loop that can be designed to reduce the up/down mismatch following the changes in voltage output. Further, the up/down current mismatch can be reduced by applying a configuration of an exemplary charge pump circuit replica bias as shown in FIG. 8.

Alternatively, a feedback network (83) determines Vup bias in order to equalize voltage output (Vr) in the replica bias circuit (82) using voltage output (Vout). The voltage output can be applied to the gate of transistor 11 (M11) and the gate of the corresponding transistor (M11'), whereby the up current of the replica bias circuit (82) and the up current of the charge pump core circuit (81) can be determined.

As the up current of the replica bias circuit (82) may be the same as the down current in accordance with Kirchhoff's Current Law (KCL), the up/down currents may also be the same regardless of the voltage output in a charge pump circuit (81) having a similar configuration.

Figure 1:
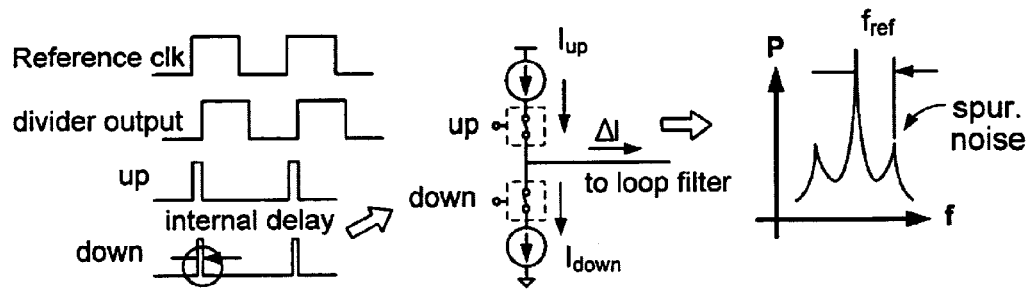
FIG. 1(a) illustrates mismatch and feed-through of up/down currents in a conventional charge pump, with a time-waveform interval of internal delay where both up/down current signals merge.
FIG. 1(b) also illustrates mismatch and feed-through of up/down currents in a conventional charge pump where paths of up/down currents are shown merging at the indicated internal delay interval.
FIG. 1(c) further illustrates mismatch and feed-through of up/down currents in a conventional charge pump where a difference between the two currents causes periodic noise to the control voltage, even if the phase of the waveform is locked.
Figure 2:
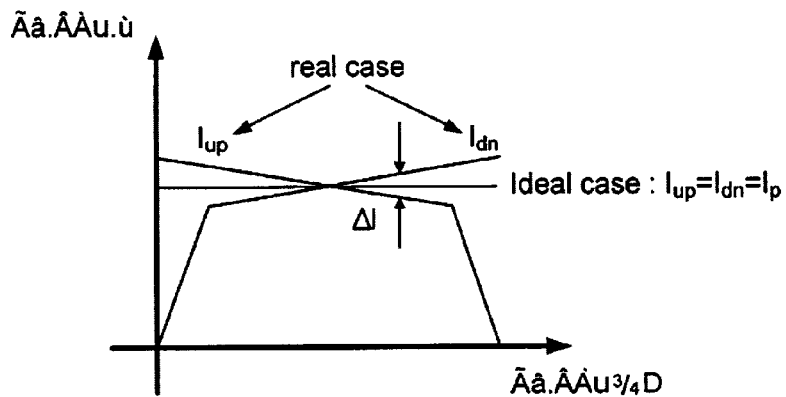
FIG. 2 illustrates a graph of current output with regard to voltage output of a conventional charge pump.
Figure 3:
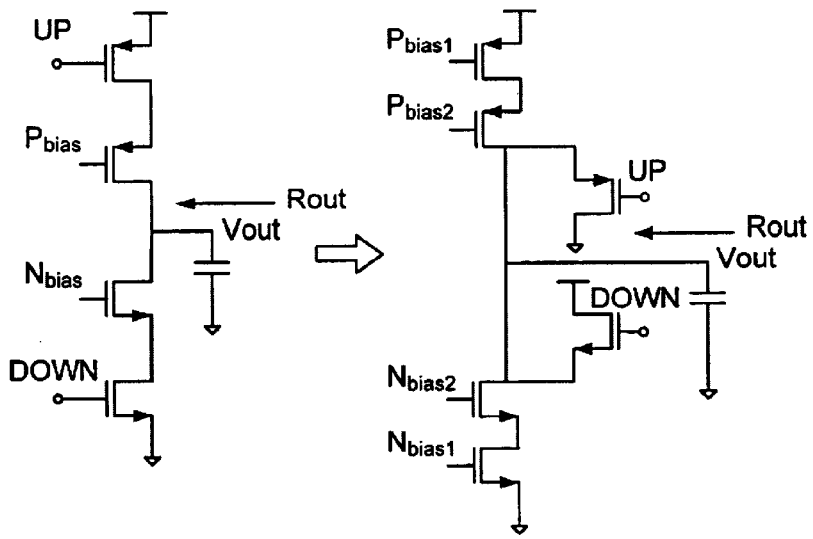
FIG. 3 illustrates a conventional charge pump circuit.
Figure 4:
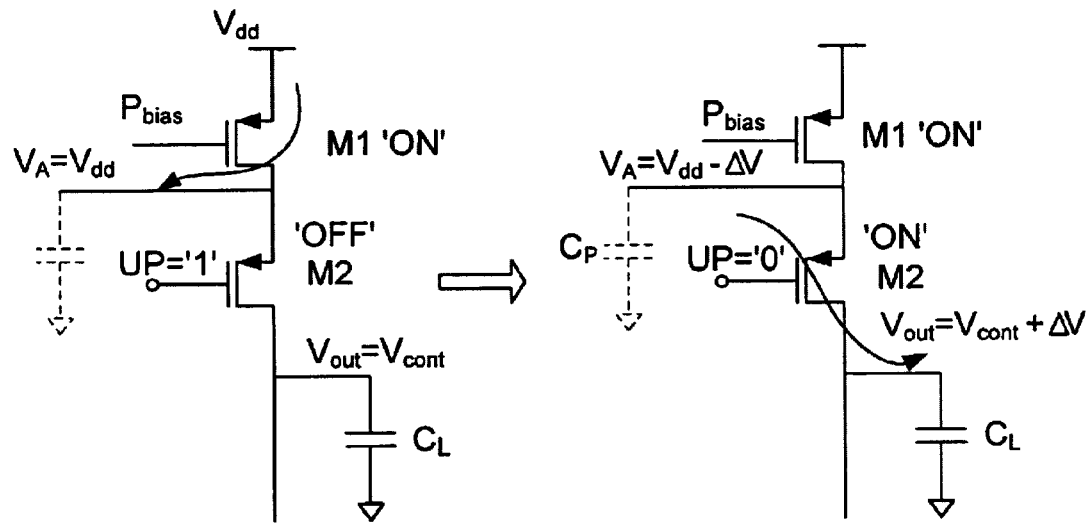
FIG. 4 illustrates a conventional circuit diagram for explaining the effect of charge distribution in a typical charge pump.
Figure 5:
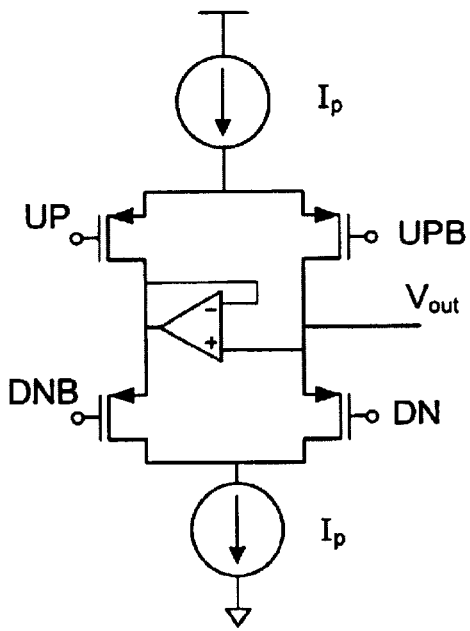
FIG. 5 illustrates an alternative conventional charge pump circuit.
Figure 6:
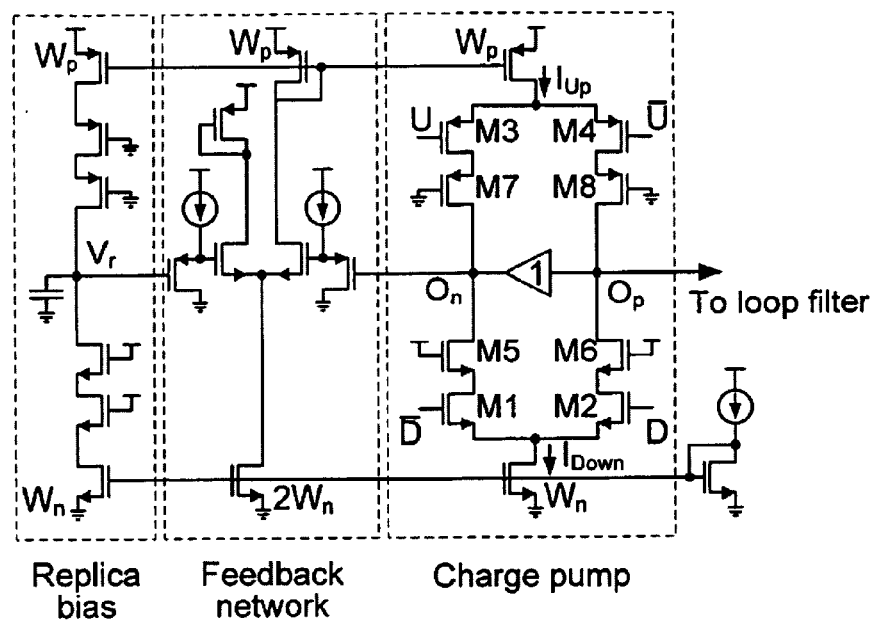
FIG. 6 illustrates another alternative conventional charge pump circuit.

Unlike the conventional circuit illustrated in FIG. 6, as the output of the charge pump circuit (81) in FIG. 8 is directly connected to the output of the op amp (83a) in the feedback network (83), the circuit can operate properly in a wide range of output voltages (Vout) without a unit-gain buffer of wide dynamic range. Also, as the up/down signals may not be fed through to the voltage, Vr, the circuit can reduce the up/down current mismatch (due to size mismatch or limited output resistance) and noise due to feed-through. However, in order to implement these functions, the op amp (83a) of feedback network (83) may operate in the right area, and the compensating capacitor (CP) may be connected for feedback stability between the gate and the drain of transistor 7 (M7') of the replica bias circuit (82).

Figure 9:
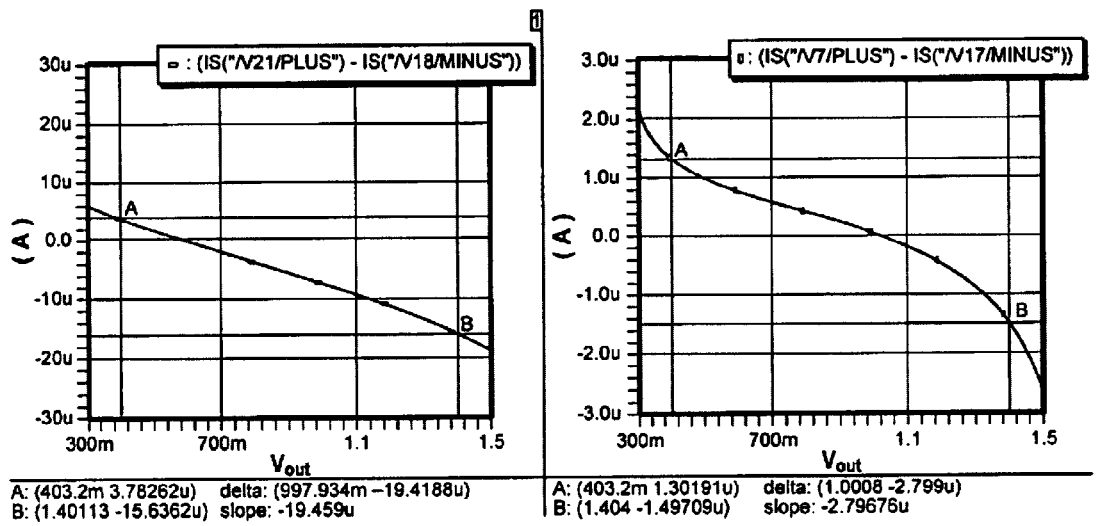
FIG. 9 is a graph illustrating results for mismatch up/down currents for an exemplary charge pump circuit for PLL.

FIG. 9 shows simulated results of an exemplary charge pump circuit for a phase locked loop, comparing the mismatch of up/down currents, without and with the replica bias circuit shown in FIGS. 7 and 8. When the voltage output level is 0.4 to 1.4 V and the nominal pumping current is 50 $\mu A$, the mismatch of the up/down currents is $\pm 10\mu$ without the replica, or $\pm 1.5\mu$ with the replica, demonstrating the effectiveness of the replica bias circuit.

Figure 10:
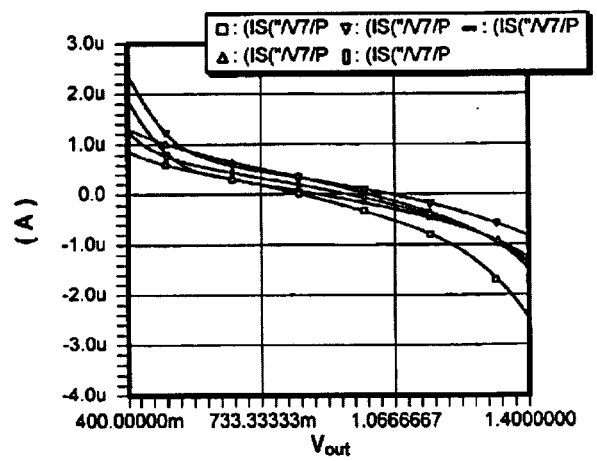
FIG. 10 is a graph illustrating further results for up/down current mismatch for an exemplary charge pump circuit for PLL.

FIG. 10 further illustrates simulations of up/down current mismatch at each corner, which shows the mismatch within the range of $\pm 1.5\mu$ even with changes as described above.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A charge pump comprising:
   a charge pump core circuit including a first transistor having a first source, a first drain, and a first gate to which a reference voltage is applied and a second transistor having a second source jointly connected to a source of the first transistor, a second gate to which a control voltage is applied, and a second drain to which a power supply voltage is applied;

a feedback network configured to determine a voltage bias using a first voltage output from an output terminal of a replica bias circuit and a second voltage output from the charge pump core circuit, wherein the replica bias circuit is a replica of the charge pump core circuit and the voltage bias is fed back from the feedback network to the replica bias circuit and the charge pump core circuit to equalize the first voltage output and the second voltage output:

a current source connected between a common source of the first and second transistors and a ground; and the output terminal formed at a point responsive to the first and second transistors for forming a charging and discharging path of a capacitor.

2. A charge pump as recited in claim 1 wherein the feedback network includes an op amp wherein a non-inverting terminal is connected to the output terminal of the charge pump core circuit and an inverting terminal of the op amp is connected to an output terminal of the replica bias circuit and an output terminal of the on amp is connected to transistor gate in the replica bias circuit and a corresponding transistor gate in the charge pump core circuit, wherein the first transistor gate in the replica bias circuit is a replica of the corresponding transistor gate in the charge pump core circuit.

3. A charge pump as recited in claim 1 wherein the charge pump core circuit further comprises:
   a second gate connected to a third transistor of the charge pump core circuit and to a corresponding transistor in the replica bias circuit, wherein a fourth source, a fourth gate, and a fourth drain of the corresponding transistor are connected to each other, wherein the corresponding transistor in the replica bias circuit is a replica of the third transistor of the charge pump core circuit; and a current source connected between the power supply voltage and the fourth drain.

4. A charge pump as recited in claim 1 wherein the reference voltage is half of the power supply voltage.

5. A charge pump circuit as recited in claim 1 wherein the reference voltage is equal to or less than the power supply voltage.

6. A method of charging or discharging a capacitor comprising:

applying with a charge pump core circuit, a voltage to generate a control signal;

determining with a feedback network, a voltage bias using a first voltage output from a replica bias circuit and a second voltage output from the charge pump core circuit, wherein the replica bias circuit is a replica of the charge pump core circuit and the voltage bias is fed back from the feedback network to the replica bias circuit and the charge pump core circuit;

automatically adjusting a current in response to the control signal using a differential switch of said charge pump core circuit of current steering mode to equalize the first voltage output and the second voltage output based on the voltage bias; and charging or discharging with the charge pump core circuit the capacitor in response to the automatically adjusted current.

7. A charge pump as recited in claim 1 wherein a phase locked loop includes the charge pump.

* * * * *